(12) United States Patent
Aw

(10) Patent No.: US 9,093,971 B2
(45) Date of Patent: Jul. 28, 2015

(54) INVERTER-AND-SWITCHED-CAPACITOR-BASED SQUELCH DETECTOR APPARATUS AND METHOD

(75) Inventor: Chee Hong Aw, Klang (MY)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 13/997,075

(22) PCT Filed: Mar. 30, 2012

(86) PCT No.: PCT/MY2012/000073
§ 371 (c)(1),
(2), (4) Date: Oct. 7, 2013

(87) PCT Pub. No.: WO2013/147582
PCT Pub. Date: Oct. 3, 2013

(65) Prior Publication Data
US 2014/0023129 A1    Jan. 23, 2014

(51) Int. Cl.
*H03G 3/34* (2006.01)
*H04L 25/02* (2006.01)

(52) U.S. Cl.
CPC ............ *H03G 3/341* (2013.01); *H04L 25/0276* (2013.01)

(58) Field of Classification Search
CPC ....................................................... H03G 3/341
USPC ......................................... 375/224, 316, 340
See application file for complete search history.

(56) References Cited

U.S. PATENT DOCUMENTS

| 5,303,405 | A | * | 4/1994 | Simmons et al. | ............. 455/213 |
| 5,450,622 | A | | 9/1995 | Vandegraaf | |
| 2003/0112058 | A1 | * | 6/2003 | Park | ............................. 327/551 |
| 2004/0157576 | A1 | | 8/2004 | Adachi et al. | |
| 2004/0214536 | A1 | | 10/2004 | Chien | |
| 2007/0173216 | A1 | * | 7/2007 | Blum | ........................... 455/212 |

OTHER PUBLICATIONS

International Search Report and Written Opinion for PCT/MY2012/000073, mailed Dec. 18, 2012, 7 pages.

* cited by examiner

*Primary Examiner* — Leon Flores
(74) *Attorney, Agent, or Firm* — Schwabe Williamson & Wyatt PC

(57) ABSTRACT

A squelch detector includes is configured to receive a time-varying differential communication signal, and includes switched capacitors and an inverter configured to provide an indication of whether a level of the received communication signal is above or below a threshold value.

19 Claims, 4 Drawing Sheets

INVERTER-AND-SWITCHED-CAPACITOR-BASED SQUELCH DETECTOR APPARATUS AND METHOD

CROSS REFERENCE TO RELATED APPLICATION

The present application is a national phase entry under 35 U.S.C. §371 of International Application No. PCT/MY2012/000073, filed Mar. 30, 2012, entitled "INVERTER-AND-SWITCHED-CAPACITOR-BASED SQUELCH DETECTOR APPARATUS AND METHOD," which designates, among the various States, the United States of America, and the entire contents and disclosures of which are hereby incorporated by reference in their entireties.

FIELD OF THE INVENTION

This disclosure relates generally to electronic circuits. More particularly but not exclusively, the present disclosure relates to a squelch detector circuit.

BACKGROUND OF THE INVENTION

A squelch detector is typically used in a communication system having a high-speed serial interface, such as a Universal Serial Bus (USB) 2.0 system. In such implementations, a squelch detector operates to detect the presence of a differential communication signal on a serial interface communication channel. To conserve power, the unused component(s) in the serial interface channel is usually turned OFF or otherwise powered down if the squelch detector detects that there is no communication signal being sent or received. If the power level of the communication signal drops below a given threshold level, the squelch detector generates a detector output signal indicating that the channel is inactive, and the detector output signal is then used to power down the unused component(s). If the power level of the communication signal is greater than the given threshold level, the squelch detector changes the detector output signal to indicate an active status so as to power up the component(s) in the communication system.

In USB 2.0 systems, the squelch detector is typically implemented with a mixer stage and an amplifier stage. The mixer stage includes a differential offset biasing input pair of transistors and a differential input pair of transistors. The differential offset biasing input pair of transistors is coupled to two reference voltage levels (Vref and Vrefb), wherein the difference of the two reference voltage levels is the threshold voltage (Vth) used to determine whether the communication signal on the communication channel is active or inactive. The differential offset biasing input pair of transistors is coupled to the differential input pair of transistors to generate an output signal that is the subtraction of the differential threshold voltage (Vth=Vref−Vrefb) from the differential communication signal (Vin−Vinb). The mixer stage's output signal (Vin−Vinb)−Vth is sent to the amplifier stage so as to provide/amplify the detector output signal that indicates whether the differential communication signal is larger than the threshold voltage Vth. If the peak-to-peak potential of the differential communication signal is greater than the squelch detection threshold value (e.g., the threshold voltage Vth), the detector output signal will be high, thereby indicating that the communication signal is present on the communication channel. Vice versa, if the peak-to-peak potential of the differential communication signal is less than the threshold voltage Vth, the detector output signal of the squelch detector will be low, thereby indicating that the communication channel is inactive.

There are a number of drawbacks with the squelch detector described above. For example, random process variations on a chip can produce a mismatch of the differential pairs of transistors, and the mismatch in turn may cause an undesirable input offset voltage. The undesirable input offset voltage, which either adds to or subtracts from the two reference voltage levels Vref and Vrefb, leads to an inaccurate or an inadequate tripping voltage range for the squelch detector.

Moreover, the implementation of differential input pairs of transistors and the amplifier stage consumes a large amount of power due to static power used in current sources for biasing. An offset cancellation circuit may be implemented to counteract the undesired input offset voltage, but the offset cancellation circuit itself also consumes power.

Also, in certain serial interface protocols, like USB 2.0, a large input common mode range imposes a significant design challenge to keep all of the transistors in the squelch detector in saturation mode. From process to process, due to the change in transistor characteristics, a great amount of effort has to be spent in tuning the squelch detector and other circuitry to ensure the transistors are operating in the saturation region.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Figure 1:
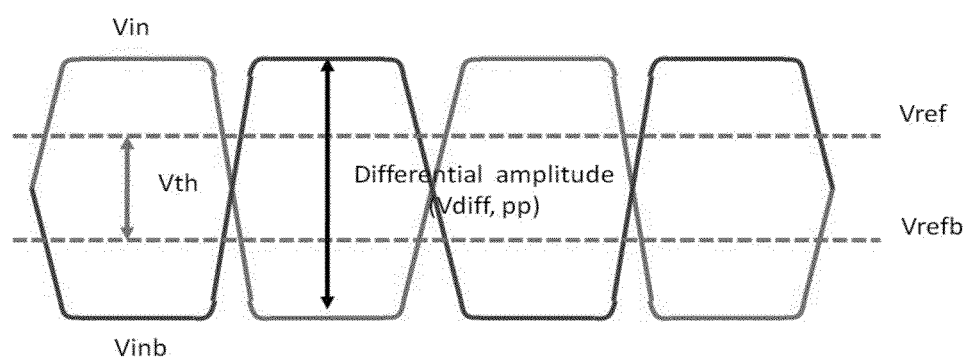
FIG. 1 illustrates example signals that may be used in accordance with one embodiment of a squelch detector.

Embodiments of a squelch detector circuit and method are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides a squelch detector that includes an inverter, capacitors, and switches. The embodiment of the squelch detector may have a switched capacitor sampling circuit topology that is able to sample rapidly varying differential signals and compare the differential amplitude against a threshold value, which is a different capability than that of conventional inverter and switched capacitor-based circuits that can only compare between two different static (or relatively slow-varying) values. As such, the squelch detector of one embodiment may detect whether differential amplitude of the communication signal is larger than a squelch threshold voltage level.

According to one embodiment, an apparatus comprises: a detector circuit to receive a time-varying differential communication signal, and including switched capacitors and an inverter to provide an indication of whether a level of the received communication signal is above or below a threshold value.

According to one embodiment of the apparatus, the time-varying differential communication signal includes a first signal and a second signal, and a peak-to-peak amplitude difference between the first and second signals provides the level of the communication signal that is compared with the threshold value.

According to one embodiment of the apparatus, the capacitors include a first capacitor coupled to receive the communication signal and a second capacitor coupled to the inverter, wherein the detector circuit further includes: a first set of switches, responsive to a first phase of a clock, to close to enable the first capacitor to store a voltage corresponding to the level of the communication signal and to enable the second capacitor to store a voltage corresponding to a difference between the threshold value and a trip level of the inverter; and a second set of switches, responsive to a second phase of the clock and that is an inverse to the first phase, to close to couple the first capacitor to the second capacitor to enable a difference between the stored voltages to be provided to the inverter, wherein the first set of switches is dosed while the second set of switches is open and vice versa.

According to one embodiment of the apparatus, the inverter is coupled to provide an output signal having a first state if the level of the communication signal is greater than the threshold value to indicate activity on a communication channel that carries the communication signal, and wherein the inverter is coupled to provide the output signal having a second state, opposite to the first state, if the level of the communication signal is less than the threshold value to indicate insufficient activity on the communication channel.

According to one embodiment of the apparatus, the first capacitor has a larger capacitance than a capacitance of the second capacitor.

According to one embodiment of the apparatus, the capacitance of the first capacitor is five times or more greater than the capacitance of the second capacitor.

According to one embodiment of the apparatus, the first set of switches includes: a first switch coupled between a first terminal of the first capacitor and a first pad that receives the first signal; a second switch coupled between a second terminal of the first capacitor and a second pad that receives the second signal; a third switch coupled between a first terminal of the second capacitor and a third pad that receives a voltage having the threshold value; and a fourth switch coupled between an output terminal of the inverter and a second terminal of the second capacitor at an input terminal of the inverter.

According to one embodiment of the apparatus, the second set of switches includes: a fifth switch coupled between ground and the first terminal of the first capacitor; and a sixth switch coupled between the second terminal of the first capacitor and the first terminal of the second capacitor.

According to one embodiment, the apparatus further comprises at least another inverter, coupled to the inverter, to provide an inverted version of an output of the detector circuit and to increase a gain of the detector circuit.

According to one embodiment, the apparatus further comprises a latch circuit coupled to the inverter.

According to one embodiment, the apparatus further comprises a clock circuit, coupled to the detector circuit, to receive input quadrature signals and to generate the clock signal to have a frequency that is at least double a frequency of each of the quadrature signals.

According to one embodiment, a method comprises: receiving, by a detector, a time-varying differential communication signal: operating a first set of switches, in response to a first phase of a clock signal, to store in a first capacitor a first voltage level corresponding to the communication signal and to store in a second capacitor a second voltage level corresponding to a threshold level; operating a second set of switches, in response to a second phase of the clock signal, to provide to an inverter a third voltage level corresponding to a difference between the stored first and voltage levels; and generating, by the inverter in response to the provided third voltage level, an output signal to indicate whether an amplitude level the communication signal exceeds the threshold level.

According to one embodiment of the method, the generating the output signal by the inverter in response to the provided third voltage level includes: determining whether the provided third voltage level is greater than a trip level of the inverter; if the third voltage level is determined to be greater than the trip level, generating the output signal to have a first state to indicate that the amplitude level of the communication signal exceeds the threshold level; and if the third voltage level is determined to be less than the trip level, generating the output signal to have a second state, opposite from the first state, to indicate that the amplitude level of the communication signal is below the threshold level.

According to one embodiment, the method further comprises powering down a component of a computer system in response to the output signal having the second state.

According to one embodiment, the method further comprises: receiving input quadrature signals each having an operating frequency; and generating, from the received quadrature signals, the clock signal to have a clock frequency of at least twice the operating frequency.

According to one embodiment of the method, the time-varying differential communication signal includes a first signal and a second signal; the operating the first set of switches to store the first voltage level corresponding to the communication signal includes operating the first set of switches to store in the first capacitor a peak-to-peak amplitude difference between the first and second signals; and the operating the first set of switches to store the second voltage level corresponding to the threshold level includes operating the first set of switches to store in the second capacitor a voltage corresponding to a difference between the threshold level and a trip level of the inverter.

According to one embodiment of the method, the first and second phases of the clock signal have opposite polarities to enable the first set of switches to be closed while the second set of switches are open and vice versa.

According to one embodiment, a system includes: a communication interface to support a communication channel that carries a time-varying differential communication signal; an inverter-and-switched-capacitor-based detector circuit, coupled to the communication interface, to detect activity by the communication signal in the communication channel and to generate an output signal to indicate whether the activity is detected; and a component, coupled to the detector, to receive the generated output signal and to power down at least a portion of the communication interface if the output signal indicates insufficient activity by the communication signal in the communication channel.

According to one embodiment of the system, the component includes a processor.

According to one embodiment of the system, the detector circuit includes: an inverter to provide the output signal and having a trip level; a first capacitor coupled to receive the communication signal and a second capacitor coupled to the inverter; a first set of switches, responsive to a first phase of a clock, to close to enable the first capacitor to store a voltage corresponding to a level of the communication signal and to enable the second capacitor to store a voltage corresponding to a difference between a threshold value and the trip level of the inverter; and a second set of switches, responsive to a second phase of the clock and that is an inverse to the first phase, to close to couple the first capacitor to the second capacitor to enable a difference between the stored voltages to be provided to the inverter, wherein the output signal indicates that there is activity the communication signal in the communication channel if the difference between the stored voltages provided to the inverter is above the trip level of the inverter.

According to one embodiment, the system further comprises a clock circuit, coupled to the detector circuit, to receive input quadrature signals and to generate the clock signal to have a frequency that is at least double a frequency of each of the quadrature signals.

Referring first to FIG. 1, voltage signals Vin and Vinb together comprise a time-varying differential communication signal that can be sent/received over a communication channel. The differential communication signal (Vin–Vinb) can be used, for example, in a communication channel of a communication system having a high-speed serial interface, such as a Universal Serial Bus (USB) 2.0 system or other communication system that operates using differential signaling.

The differential communication signal has a peak-to-peak (pp) amplitude Vdiff=Vin–Vinb. The difference between two reference voltage levels Vref and Vrefb is the squelch threshold voltage level Vth that is used to determine whether the communication signal on the communication channel is active or inactive. For example, the communication channel may be deemed to be active if Vdiff>Vth and may be deemed to be inactive if Vdiff<Vth.

Figure 2:
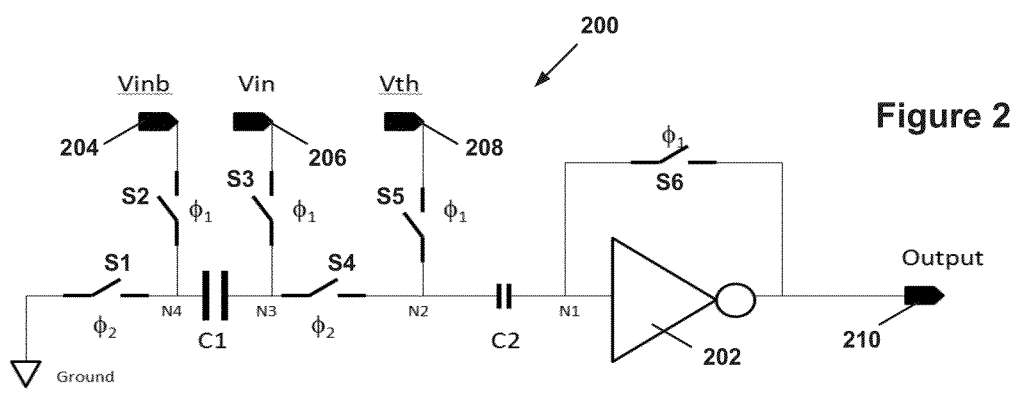
FIG. 2 is a diagram of a squelch detector that can operate with the example signals of FIG. 1, in accordance with one embodiment.

Referring now to FIG. 2, shown generally at 200 is a squelch detector of one embodiment. In one embodiment, the squelch detector 200 includes two capacitors (C1 and C2), six switches (S1-S6), and an inverter 202.

The switch S1 is coupled between ground and a node N4. The switch S2 is coupled between a first pad (or other terminal) 204 that receives the signal Vinb and the node N4. The first capacitor C1 has a first terminal coupled to the node N4 and a second terminal coupled to a node N3. The switch S3 is coupled between a second pad (or other terminal) 206 that receives the signal Vin and the node N3. The switch S4 is coupled between the node N3 and a node N2. The switch S5 is coupled between a third pad (or other terminal) 208 that has/receives the threshold voltage Vth and a node N2.

The second capacitor C2 has a first terminal coupled to the node N2 and second terminal coupled to a node N1. In one embodiment, the capacitor C1 is approximately five times larger or more in capacitance than the capacitor C2.

The switch S6 is coupled between the node N1 and an output terminal 210 of the inverter 202. The node N1 is coupled to an input terminal of the inverter 202, and so with this configuration, the input of the inverter 202 is short-circuited to its output if the switch S6 is dosed. In one embodiment, the output terminal 210 of the inverter 202 forms the output terminal of the squelch detector 200, and therefore provides the output signal of the squelch detector 200.

In one embodiment, any one or more of the switches S1-S6 can include complementary metal oxide semiconductor (CMOS) transistors, such as P-type or N-type CMOS transistors having gate terminals that each receive and respond to phases of a clock signal that is used to control the turning ON or OFF of the CMOS transistors. Therefore, the switch is closed (short circuit or connected) if the CMOS transistor is turned ON, and the switch is open (open circuit or disconnected) if the CMOS transistor is turned OFF.

Figure 3:
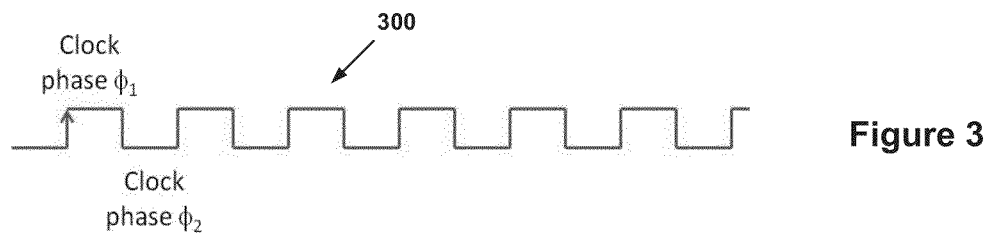
FIG. 3 shows an example clock signal that can be used for the squelch detector of FIG. 2, in accordance with one embodiment.

In one embodiment, the gate terminals of the CMOS transistors are coupled to receive either a clock pulse or an inverted clock pulse of a clock signal 300 shown in FIG. 3. The switches S2, S3, S5, and S6 (forming a first set of switches) in FIG. 2 that are labeled with $\phi_1$ will be closed (connected) if the clock pulse is high (denoted as a clock phase $\phi_1$ in FIG. 3), whereas the switches S1 and S4 (forming a second set of switches) in FIG. 2 that are labeled with $\phi_2$ will be closed (connected) if the dock pulse is low (denoted as a dock phase $\phi_2$ in FIG. 3) Hence with this arrangement, the switches S2, S3, S5, and S6 may be CMOS transistors transmission gates (comprising of N-type and/or P-type transistors) for which the gates are controlled by a clock pulse of a first polarity, and the switches S1 and S4 may be CMOS transmission gates that are controlled by a clock pulse of a second/reverse polarity.

In operation, during the clock phase $\phi_1$ in which the switches S2 and S3 are closed and switches S1 and S4 are open, the capacitor C1 is coupled to the pad 206 having the voltage Vin and to the pad 204 having the voltage Vinb, so as to sample the voltage difference (Vin–Vinb) between the signals Vin and Vinb. This voltage difference (Vin–Vinb), corresponding to the peak-to-peak amplitude level of the communication signal, is a first voltage level that is stored in the capacitor C1.

Also in operation during the clock phase $\phi_1$, in which the switches S5 and S6 are closed and the switch S4 is open, a first terminal of the capacitor C2 is coupled to the pad 208 having the voltage Vth (the squelch threshold voltage level) and a second terminal of the capacitor C2 is coupled to the input terminal of the inverter 202, thereby causing a sampling of a voltage Vtrip (the trip point/level of the inverter 202) if the input of the inverter 202 is shorted to its output. The corresponding voltage difference Vth–Vtrip is a second voltage level that is stored in the capacitor C2. In one embodiment, the threshold voltage Vth may be directly set instead of doing the subtraction of Vref and Vrefb.

During the clock phase $\phi_2$ in which the switches S1 and S4 are closed and the other switches are open, a first terminal of the capacitor C1 is coupled to ground, and a second terminal will have the voltage potential of Vin–Vinb. Since the capacitor C1 of one embodiment is selected to be at least five times larger than the capacitor C2, the capacitor C1 appears or otherwise acts like a constant voltage source to capacitor C2.

Because the capacitor C1 is coupled to the capacitor C2 during the clock phase 4, the point of connection between these two capacitors will be forced to the potential of Vin–Vinb.

Since the capacitor C2 stores the voltage difference Vth–Vtrip, the input terminal of the inverter 202 will receive or be otherwise provided with a potential level of that is a difference between the voltages stored in the capacitors C1 and C2. That is, the input terminal of the inverter 202 will see/receive a third voltage level (Vin–Vinb)–(Vth–Vtrip)=Vtrip+[(Vin–Vinb)–Vth]. If Vin–Vinb>Vth as a result of activity on the communication channel that carries the communication signal, then the potential level at the input terminal of the inverter 202 is determined to be greater than Vtrip, and so the inverter 202 will output low (e.g., a first state of the output signal of the squelch detector 200) at the output terminal 210. If Vin–Vinb<Vth as a result of absent/insufficient activity by the communication signal on the communication channel, then the potential level at the input terminal of the inverter 202 is determined to be lower than Vtrip, and the inverter 202 will output high (e.g., a second state, opposite or inverse to the first state, of the output signal of the squelch detector 200) at the output terminal 210.

Figure 5:
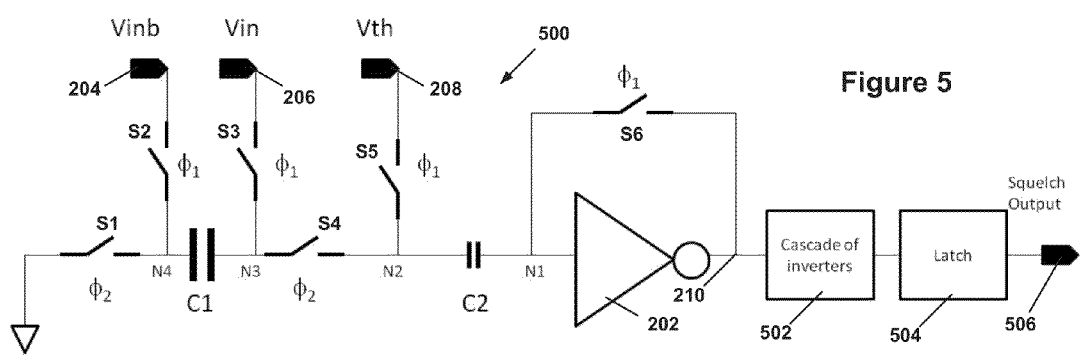
FIG. 5 is a diagram of another embodiment of a squelch detector.

The output signal of the inverter 202 is a negative of its input signal. If the output of a squelch detector is desired to be positive, then at least one inverter can be coupled to the inverter 202, such as in a cascaded manner, so as to provide an inverted version of the output signal of the inverter 202. FIG. 5 shows an embodiment of a squelch detector 500 having a cascade of inverters 502 coupled to the output terminal 210 of the inverter 202. Cascading inverters such as shown in the embodiment of FIG. 5 can also increase the overall gain of the squelch detector 500.

In one embodiment, a latch circuit 504 can be coupled to the cascade of inverters 502. The latch circuit 504 can be used for example to store a state (e.g., high or low) of the output of the cascade of inverters 502, until the output changes state. An output of terminal 506 of the latch circuit 504 provides the output signal (labeled as "squelch output") of the squelch detector 500.

As explained above, the various embodiments of the squelch detector operate as a switched-capacitor sampling circuit that uses the clock signal 300 to switch between the circuit connections during different clock phases. According to the Nyquist sampling theorem, the sampling/clock frequency provided by the clock signal 300 of one embodiment should be at least twice the highest frequency contained in the differential communication signal.

For example, a USB 2.0 system may operate with an approximately 480 MHz clock, and so the sampling frequency should be approximately 960 MHz or greater. In one embodiment, no additional/dedicated higher-frequency clock is needed from a phase locked loop (PLL), since sending the higher-frequency clock from the PLL to the squelch detector may consume additional power. Instead, one embodiment of the squelch detector may use existing clocking to provide the clock signal 300 with a sufficiently high frequency.

Figure 4:
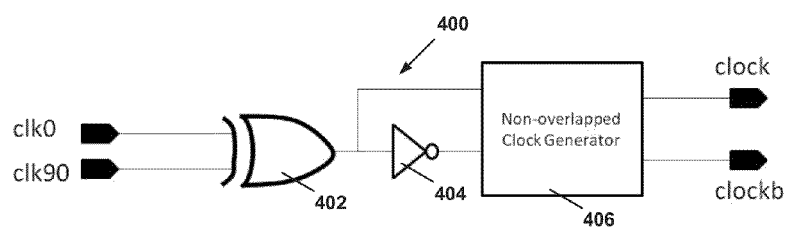
FIG. 4 is a diagram of a clock circuit that can be used to provide one or more clock signals for the squelch detector of FIG. 2, in accordance with one embodiment.

For example, in one embodiment for a high-speed serial interface, the quadrature clocks clk0 and clk90 (at 0° and 90° phases, respectively) at the operating frequency of 480 MHz are available. In a clock circuit 400 of FIG. 4, these quadrature clocks clk0 and clk90 are utilized to generate the sampling clock signal 300 with double the operating frequency. With USB 2.0 for instance, the 480 MHz clocks clk0 and clk90 (respectively at 0° and 90°) can be logically operated on (e.g., exclusively OR'ed together) to provide an output dock with frequency of 960 MHz.

Figure 6:
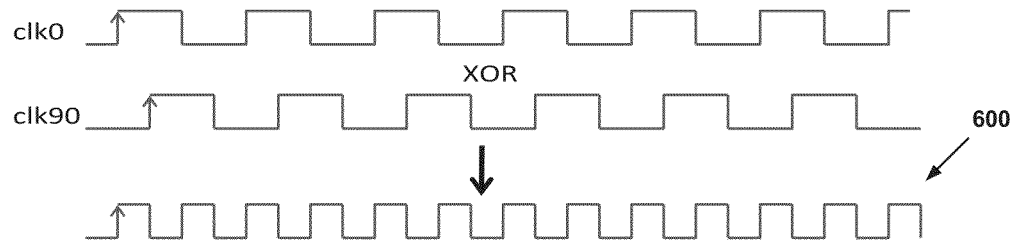
FIG. 6 show example clock signals for the clock circuit of FIG. 4, in accordance with one embodiment.

The clock circuit 400 includes an exclusive OR (XOR) gate 402 having two input terminals that respectively receive the quadrature input clock signals clk0 and clk90. An output terminal of the exclusive OR gate 402 provides a clock signal 600 that has double the frequency of the input clock signals clk0 and clk90, such as shown by way of example in FIG. 6. The output terminal of the exclusive OR gate 402 is coupled to an input terminal of an inverter 404, which in turn has an output terminal coupled to a first input terminal of a non-overlapped clock generator 406. The output terminal of the exclusive OR gate 402 is also coupled to a second input terminal of the clock generator 406. The clock generator 406 of one embodiment is configured to receive clock and inverted clock signals to generate non-overlapping clock signals as output signals. For example, the clock generator 406 outputs two clock signals "clock" and "clockb", both of which have double the operating frequency of clock signals clk0 and clk90. Either of the clock signals "clock" and "clockb" in FIG. 4 can be used as the clock signal 300 of FIG. 3.

The following example scenarios A, B, and C are provided so as to further illustrate operation of the various embodiments of the squelch detector disclosed herein:

A. Vin is greater than Vinb by 0.15V (e.g., a value greater than Vth=0.1V), and with the sampling clock frequency=1 GHz, Vin=0.35V, Vinb=0.2V, and Vth=0.1V During the clock phase $\phi_1$ (the clock signal 300 is high), the node N4 is coupled to Vinb=0.2V; the node N3 is coupled to Vin=0.35V; the node N2 is coupled to Vth=0.1V; the node N1 has the potential of Vtrip of the inverter 202 since the input terminal of the inverter 202 is shorted to the output terminal 210. After sampling those voltages, during the clock phase $\phi_2$ (the clock signal 300 is low), the node N4 is coupled to ground. Since the capacitor C1 has the voltage difference of Vin–Vinb=0.15V across it, the voltage at the node N3 becomes 0.15V. Due to the capacitor C1 having a larger capacitance than the capacitor C2, the node N2 is forced to the voltage of 0.15V as well.

The voltage at the node N1 changes from Vtrip to $$Vtrip+[(Vin-Vinb)-Vth]=Vtrip+0.05V=0.5V+0.05V=0.55V.$$

Since the node N1 is 0.05V above the Vtrip of the inverter 202, the output by the inverter 202 (at the output terminal 210) will be low during the clock phase 64. The low output of the inverter 202 confirms or otherwise indicates that there is activity on the communication channel (e.g., (Vin–Vinb)>Vth).

B. Vin is greater than Vinb by 0.05V (e.g., a value less than Vth=0.1V), and with the sampling clock frequency=1 GHz, Vin=0.25V, Vinb=0.2V, and Vth=0.1V During clock phase $\phi_1$ (the clock signal 300 is high), the node N4 is coupled to Vinb=0.2V; the node N3 is coupled to Vin=0.25; the node N2 is coupled to Vth=0.1V; the node N1 has the potential of Vtrip of the inverter 202 since the input terminal of the inverter 202 is shorted to the output terminal 210. After sampling those voltages, during the clock phase $\phi_2$ (the clock signal 300 is low), the node N4 is coupled to ground. Since the capacitor C1 has the voltage difference of Vin–Vinb=0.05V across it, the voltage at the node N3 becomes 0.05V. Due to the capacitor C1 having a larger capacitance than the capacitor C2, the node N2 is forced to the voltage of 0.05V as well.

The voltage at the node N1 changes from Vtrip to Vtrip+[(Vin–Vinb)–Vth]=Vtrip–0.05V=0.5V–0.05V=0.45V. Since the node N1 is 0.05V below the Vtrip of the inverter 202, the output generated by the inverter 202 (at the output terminal 210) will be high during the clock phase k. The high output of the inverter 202 confirms or otherwise indicates that activity is absent or insufficient in the communication channel (e.g., (Vin−Vinb)<Vth).

C. Vin is less than Vinb, and with the sampling clock frequency=1 GHz, Vin=0.3V, Vinb=0.5V, Vth=0.1V During the clock phase $\phi_1$ (the clock signal 300 is high), the node N4 is coupled to Vinb=0.5V; the node N3 is coupled to Vin=0.3; the node N2 is coupled to Vth=0.1V; the node N1 has the potential of the Vtrip of the inverter 202 since the input terminal of the inverter 202 is shorted to the output terminal 210. After sampling those voltages, during the clock phase $\phi_2$ (the clock signal 300 is low), the node N4 is coupled to ground. Since the capacitor C1 has the voltage difference of Vin−Vinb=−0.2V across it, the voltage at the node N3 becomes around −0.2V. Due to the capacitor C1 having a larger capacitance than the capacitor C2, the node N2 is forced to the voltage of −0.2V as well.

The voltage at the node N1 changes from Vtrip to Vtrip+[(Vin−Vinb)−Vth]=Vtrip−0.3V=0.5V−0.3V=−0.2V. Since the node N1 is 0.3V below the Vtrip of the inverter 202, the output terminal 210 of the inverter 202 will be high. The high output generated by the inverter 202 confirms or otherwise indicates that activity is absent or insufficient in the communication channel (e.g., (Vin−Vinb)<Vth).

The embodiments(s) of the squelch detector(s) disclosed herein provide at least the following features that are different from conventional squelch detectors:

Low power consumption, since various power-consuming components of conventional squelch detectors are omitted;

No amplifier and current source are involved. Thus, there is no static current, and instead dynamic current is consumed during switching. Current consumption may be around 300 uA, for example, as compared to conventional mixer and amplifier stage-based architectures that consume 1-2 mA or higher due to usage of current sources for biasing;

The circuit design of one embodiment of the squelch detector is relatively simple compared to conventional mixer and amplifier stage-based squelch detectors;

Conventional mixer and amplifier stage-based squelch detectors attempt to match all of the devices in the circuit in order to reduce the input offset voltage. On the contrary, there is no stringent requirement on device matching of one embodiment of the squelch detector disclosed herein, since the Vtrip of the inverter 202 is already stored in the capacitor C2 during the clock phase $\phi_1$ and the operation is not dependent on the matching of any device. The capacitor C1 is designed to be relatively larger than the capacitor C2 so that the capacitor C1 appears to be a constant voltage source if the capacitor C1 is coupled to the capacitor C2; and There is simpler migration from process to process. This is because the squelch detector of one embodiment does not require the component devices to operate in the saturation region, as compared to conventional mixer and amplifier stage-based squelch detectors that are retuned when migrated to a new process, so as to ensure all the devices are operating in the saturation region.

Embodiments of the squelch detector(s) described herein may be used in a number of implementations and applications. For example, mobile devices, including but not limited to smart phones, nettops, tablets and other Mobile Internet Devices (MIDs) may have circuit(s) that would benefit from improved squelch detection operation. In such implementations, the squelch detector can be used to provide an output signal that triggers activation or deactivation of various components based on whether there is signal activity in a communication channel.

Figure 7:
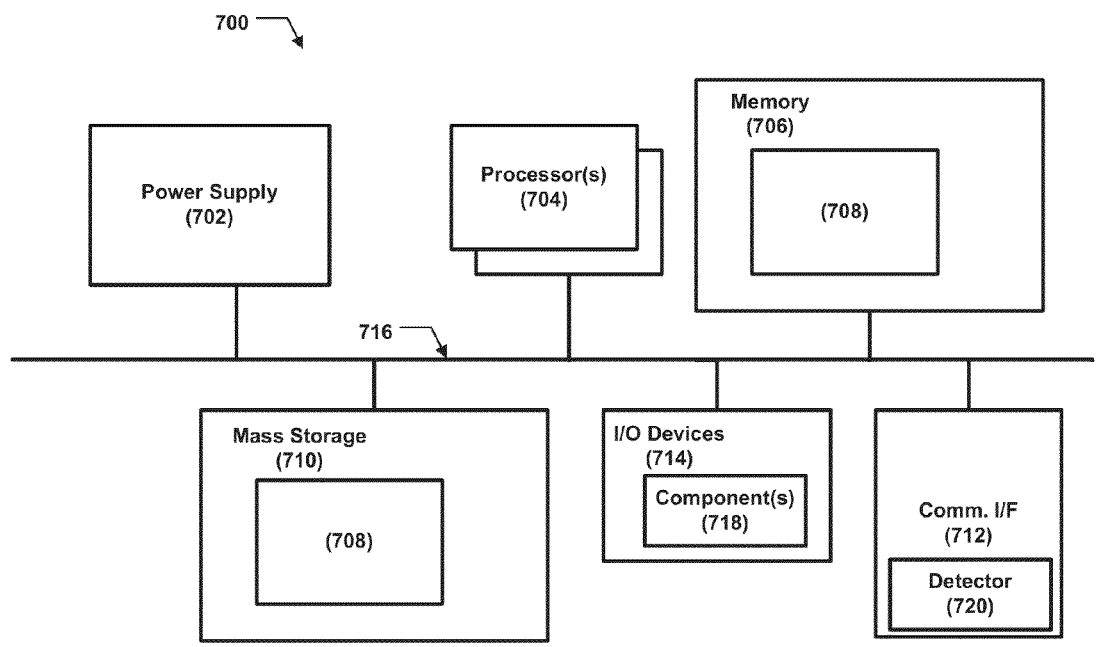
FIG. 7 is a block diagram that illustrates an example computer system suitable to practice the disclosed squelch detector, in accordance with various embodiments.

FIG. 7 is a block diagram that illustrates an example computer system 700 suitable to practice the disclosed squelch detector circuit/method of various embodiments.

As shown, the computer system 700 may include a power supply unit 702, a number of processors or processor cores 704, a system memory 706 having processor-readable and processor-executable instructions 708 stored therein, a mass storage device 710 that may also store the instructions 708, and a communication interface 712. For the purpose of this application, including the claims, the terms "processor" and "processor cores" may be considered synonymous, unless the context clearly requires otherwise.

In various embodiments of the present disclosure, at least one of the processors 704, including a controller, may generate or cause to be generated a signal to trigger activation/deactivation of various components (such as powering down or powering up at least a portion of the communication interface 712 and/or other components) of the system 700 in response to the processor 704 receiving or otherwise evaluating the state of the output signal provided by the squelch detector. In other embodiments, various other components (internal or external to the system 700) may generate one or more of such signals in response to the output signal from the squelch detector.

The one or more mass storage devices 710 and/or the memory 706 may comprise a tangible, non-transitory computer-readable storage device (such as a diskette, hard drive, compact disc read only memory (CDROM), hardware storage unit, flash memory, phase change memory (PCM), solid-state drive (SSD) memory, and so forth). The instructions 708 stored in the mass storage devices 710 and/or the memory 706 may be executable by one or more of the processors 704.

The computer system 700 may also comprise input/output devices 714 (such as a keyboard, display screen, cursor control, and so forth). In various embodiments and purely by way of example, the I/O devices 714 may include component(s) 718 that send/receive a differential communication signal or otherwise provide/support the communication channel on which the differential communication signal is carried, and the component(s) 718 may themselves include or be otherwise coupled to the squelch detector. The squelch detector and related circuitry (or other components of the system 700) may alternatively or additionally be located elsewhere in the computer system 700, and may comprise part or all of an integrated circuit. For instance, a detector 720 may comprise part of a communication interface 712 and may include the embodiment(s) of the squelch detector described herein.

The various elements of FIG. 7 may be coupled to each other via a system bus 716, which represents one or more buses. In the case of multiple buses, they may be bridged by one or more bus bridges (not shown). Data may pass through the system bus 716 through the I/O devices 714, for example, between the output terminal of the squelch detector and the processors 704. The output signal from the squelch detector may also be sent between discrete chips on a Multi-Chip Package (MCP). In one embodiment, such MCP could represent one or more processors 704 or any other component of system 700. In one embodiment a portion or all of the memory 706 could be integrated on an MCP with one or more processors 704. In one embodiment, one or more chips in system 700 may have a squelch detector.

The system memory 706 and the mass storage device 710 may be employed to store a working copy and a permanent copy of the programming instructions implementing one or more operating systems, firmware modules or drivers, applications, and so forth, herein collectively denoted as 708. The permanent copy of the programming instructions may be placed into permanent storage in the factory, or in the field, through, for example, a distribution medium (not shown), such as a compact disc (CD), or through the communication interface 712 (from a distribution server (not shown)).

According to various embodiments, one or more of the depicted components of the system 700 and/or other element(s) may include a keyboard, LCD screen, non-volatile memory port, multiple antennas, graphics processor, application processor, speakers, or other associated mobile device elements, including a camera.

The remaining constitution of the various elements of the computer system 700 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, specific types of logic gates and/or logic configurations, and so forth. In other embodiments, different configurations can be provided in view of whether or not certain signals are inverted, whether certain changes in state are triggered in response to falling edges instead of rising edges or vice versa, different logic gate configurations, and so forth.

These and other modifications can be made in light of the above detailed description. The terms used in the following claims should not be construed to be limited to the specific embodiments disclosed in the specification.

The invention claimed is:

1. An apparatus, comprising:
   a detector circuit to receive a time-varying differential communication signal, and including switched capacitors and an inverter to provide an indication of whether a level of the received communication signal is above or below a threshold value,
   wherein the capacitors comprises a first capacitor coupled to receive the communication signal and a second capacitor coupled to the inverter, the detector circuit further including:
   a first set of switches, responsive to a first phase of a clock, to enable the first capacitor to store a voltage corresponding to the level of the communication signal and to enable the second capacitor to store a voltage corresponding to a difference between the threshold value and a trip level of the inverter; and
   a second set of switches, responsive to a second phase of the clock and that is an inverse to the first phase, to couple the first capacitor to the second capacitor to enable a difference between the stored voltages to be provided to the inverter,
   wherein the first set of switches is closed while the second set of switches is open and vice versa.

2. The apparatus of claim 1, wherein the time-varying differential communication signal comprises a first signal and a second signal, and wherein a peak-to-peak amplitude difference between the first and second signals provides the level of the communication signal that is compared with the threshold value.

3. The apparatus of claim 1, wherein the inverter is coupled to provide an output signal having a first state if the level of the communication signal is greater than the threshold value to indicate activity on a communication channel that carries the communication signal, and
   wherein the inverter is coupled to provide the output signal having a second state, opposite to the first state, if the level of the communication signal is less than the threshold value to indicate insufficient activity on the communication channel.

4. The apparatus of claim 1, wherein the first capacitor has a larger capacitance than a capacitance of the second capacitor.

5. The apparatus of claim 4, wherein the capacitance of the first capacitor is five times or more greater than the capacitance of the second capacitor.

6. The apparatus of claim 1, wherein the first set of switches comprises
   a first switch coupled between a first terminal of the first capacitor and a first pad that receives the first signal;
   a second switch coupled between a second terminal of the first capacitor and a second pad that receives the second signal;
   a third switch coupled between a first terminal of the second capacitor and a third pad that receives a voltage having the threshold value; and
   a fourth switch coupled between an output terminal of the inverter and a second terminal of the second capacitor at an input terminal of the inverter.

7. The apparatus of claim 6, wherein the second set of switches comprises
   a fifth switch coupled between ground and the first terminal of the first capacitor; and
   a sixth switch coupled between the second terminal of the first capacitor and the first terminal of the second capacitor.

8. The apparatus of claim 1, further comprising:
   at least another inverter, coupled to the inverter, to provide an inverted version of an output of the detector circuit and to increase a gain of the detector circuit.

9. The apparatus of claim 8, further comprising:
   a latch circuit coupled to the inverter.

10. An apparatus comprising:
    a detector circuit to receive a time-varying differential communication signal, and including switched capacitors and an inverter to provide an indication of whether a level of the received communication signal is above or below a threshold value; and
    a clock circuit, coupled to the detector circuit, to receive input quadrature signals and to generate the clock signal to have a frequency that is at least double a frequency of each of the quadrature signals.

11. A method, comprising:
    receiving, by a detector, a time-varying differential communication signal;
    operating a first set of switches, in response to a first phase of a clock signal, to store in a first capacitor a first voltage level corresponding to the communication signal and to store in a second capacitor a second voltage level corresponding to a threshold level;
    operating a second set of switches, in response to a second phase of the clock signal, to provide to an inverter a third voltage level corresponding to a difference between the stored first and voltage levels; and
    generating, by the inverter in response to the provided third voltage level, an output signal to indicate whether an amplitude level the communication signal exceeds the threshold level.

12. The method of claim 11, wherein the generating the output signal by the inverter in response to the provided third voltage level comprises determining whether the provided third voltage level is greater than a trip level of the inverter;

if the third voltage level is determined to be greater than the trip level, generating the output signal to have a first state to indicate that the amplitude level of the communication signal exceeds the threshold level; and if the third voltage level is determined to be less than the trip level, generating the output signal to have a second state, opposite from the first state, to indicate that the amplitude level of the communication signal is below the threshold level.

13. The method of claim 12, further comprising:

powering down a component of a computer system in response to the output signal having the second state.

14. The method of claim 11, further comprising:

receiving input quadrature signals each having an operating frequency; and generating, from the received quadrature signals, the clock signal to have a clock frequency of at least twice the operating frequency.

15. The method of claim 11, wherein the time-varying differential communication signal comprises a first signal and a second signal;

the operating the first set of switches to store the first voltage level corresponding to the communication signal comprises operating the first set of switches to store in the first capacitor a peak-to-peak amplitude difference between the first and second signals; and the operating the first set of switches to store the second voltage level corresponding to the threshold level comprises operating the first set of switches to store in the second capacitor a voltage corresponding to a difference between the threshold level and a trip level of the inverter.

16. The method of claim 11, wherein the first and second phases of the clock signal have opposite polarities to enable the first set of switches to be closed while the second set of switches are open and vice versa.

17. A system, comprising:

a communication interface to support a communication channel that carries a time-varying differential communication signal;

an inverter-and-switched-capacitor-based detector circuit, coupled to the communication interface, to detect activity by the communication signal in the communication channel and to generate an output signal to indicate whether the activity is detected; and a component, coupled to the detector, to receive the generated output signal and to power down at least a portion of the communication interface if the output signal indicates insufficient activity by the communication signal in the communication channel, wherein the detector circuit comprises an inverter to provide the output signal and having a trip level;

a first capacitor coupled to receive the communication signal and a second capacitor coupled to the inverter;

a first set of switches, responsive to a first phase of a clock, to enable the first capacitor to store a voltage corresponding to a level of the communication signal and to enable the second capacitor to store a voltage corresponding to a difference between a threshold value and the trip level of the inverter; and a second set of switches, responsive to a second phase of the clock and that is an inverse to the first phase, to couple the first capacitor to the second capacitor to enable a difference between the stored voltages to be provided to the inverter, wherein the output signal indicates that there is activity the communication signal in the communication channel if the difference between the stored voltages provided to the inverter is above the trip level of the inverter.

18. The system of claim 17, wherein the component comprises a processor.

19. The system of claim 17, further comprising:

a clock circuit, coupled to the detector circuit, to receive input quadrature signals and to generate the clock signal to have a frequency that is at least double a frequency of each of the quadrature signals.

* * * * *